United States Patent [19]

Tullis

[11] Patent Number: 4,534,389
[45] Date of Patent: Aug. 13, 1985

[54] INTERLOCKING DOOR LATCH FOR DOCKABLE INTERFACE FOR INTEGRATED CIRCUIT PROCESSING

[75] Inventor: Barclay J. Tullis, Palo Alto, Calif.

[73] Assignee: Hewlett-Packard Company, Palo Alto, Calif.

[21] Appl. No.: 594,498

[22] Filed: Mar. 29, 1984

[51] Int. Cl.³ .............................................. B65B 1/00
[52] U.S. Cl. ..................................... 141/98; 141/383; 414/292; 220/256
[58] Field of Search .......................... 141/98, 319–323, 141/346, 383–386, 91, 92, 4–8; 220/20.5, 23, 256; 188/500; 414/217, 221, 292

[56] References Cited

U.S. PATENT DOCUMENTS

| | | | |
|---|---|---|---|
| 3,260,381 | 7/1966 | Wagner et al. | 414/292 |
| 3,294,670 | 12/1966 | Charchan et al. | 414/217 X |
| 4,047,624 | 9/1977 | Porenbos | 414/217 |
| 4,089,341 | 5/1978 | Okaya | 137/68 R |
| 4,201,310 | 5/1980 | Glachet | 220/256 |
| 4,260,312 | 4/1981 | Hackney | 414/292 |
| 4,281,691 | 8/1981 | Goutard et al. | 141/98 |

FOREIGN PATENT DOCUMENTS 938311 10/1963 United Kingdom ................. 414/292

*Primary Examiner*—Stephen Marcus
*Assistant Examiner*—Ernest G. Cusick
*Attorney, Agent, or Firm*—Jeffery B. Fromm

[57] ABSTRACT

A particle-free dockable interface with an interlocking latch is disclosed for linking together two spaces each enclosing a clean air environment and preventing the opening of the interface without the presences of two mating system components. The interface comprises interlocking doors on each space which fit together to trap particles which have accumulated from the dirty ambient environment on the outer surfaces of the doors. The interlocking latch is comprised of a latch spring and latch foot assembly coupled to a first one of the two clean air spaces and a mating door pull and port latch assembly coupled to the second of the two clean air spaces. The latch foot, door pull, and port latch assemblies are constructed so that interlock doors cannot be opened unless the first and second clean air spaces are properly aligned and mated.

8 Claims, 36 Drawing Figures

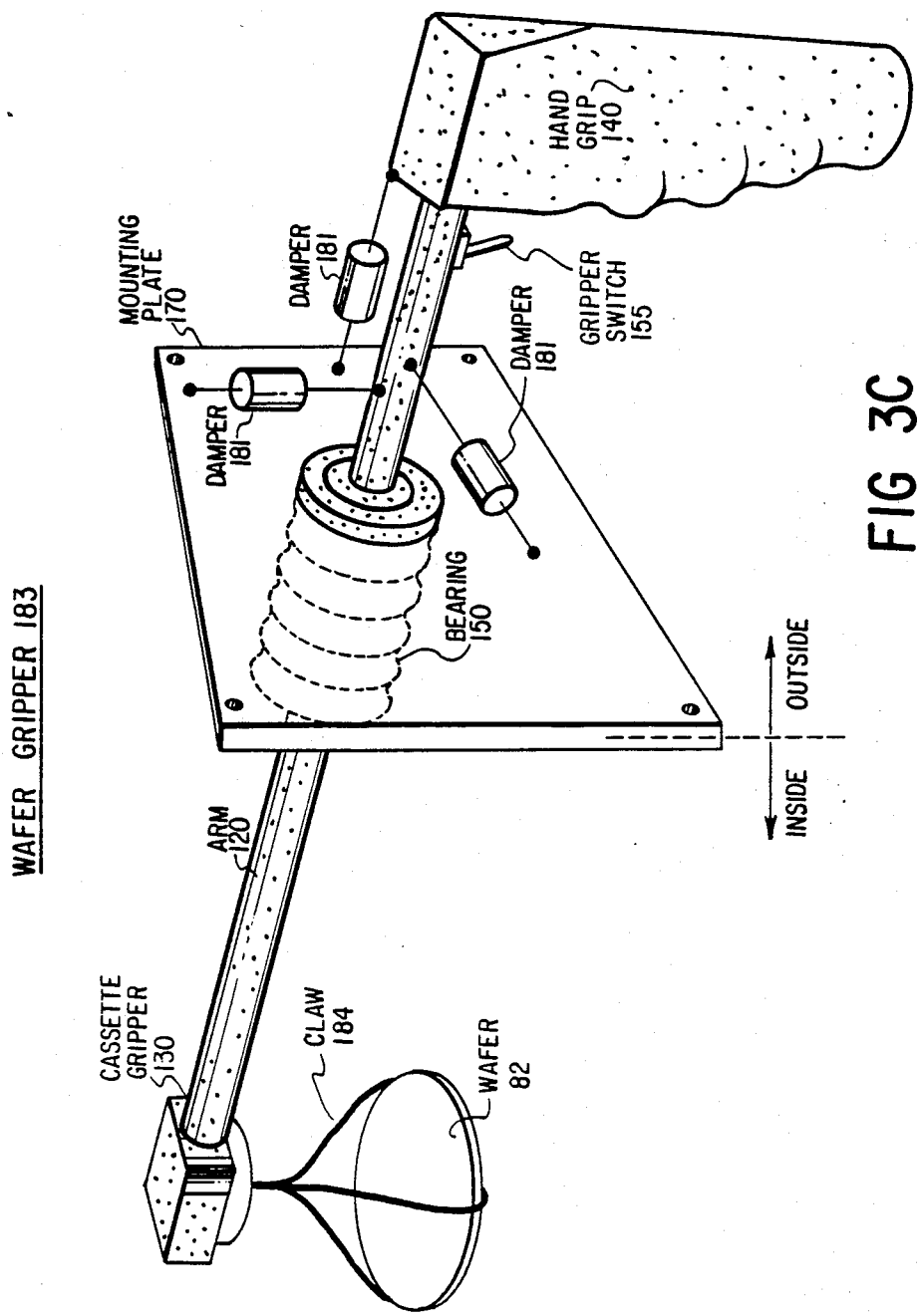

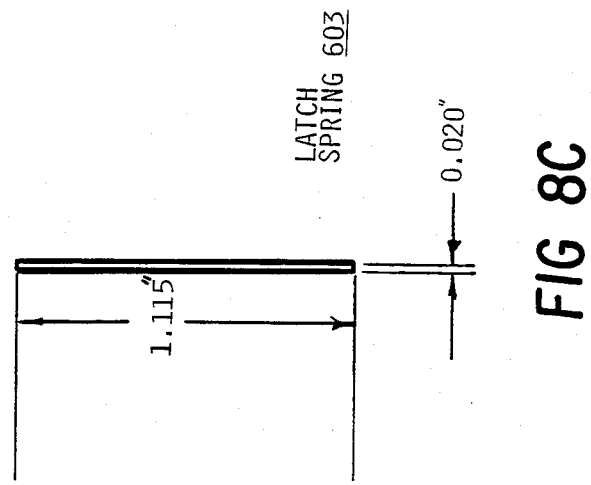
*FIG 8C*
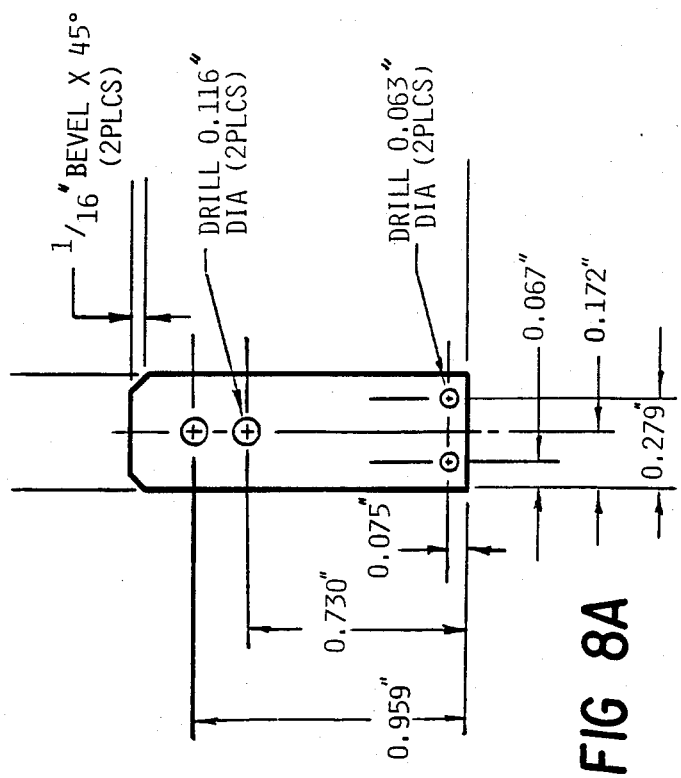
*FIG 8B*
*FIG 8A*

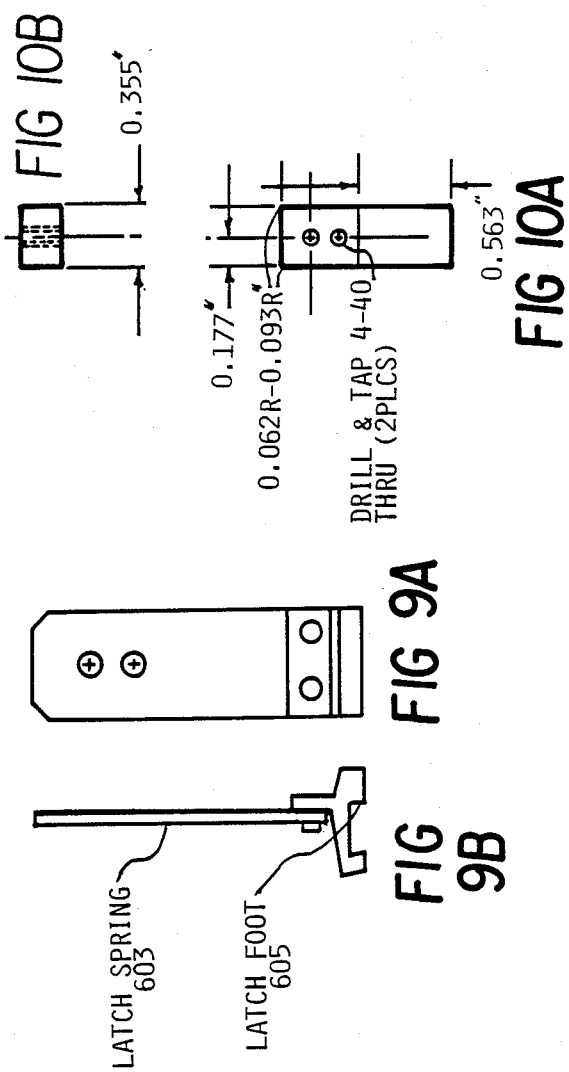
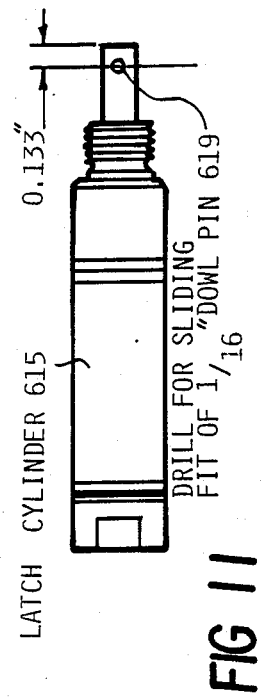

SUPPORT 618

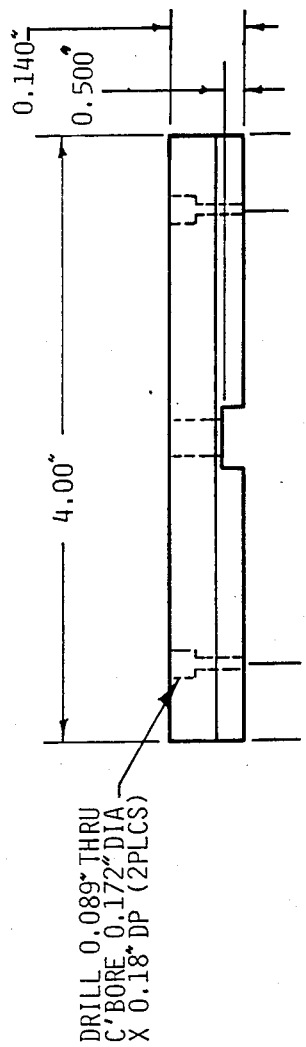

DOOR PULL 617

DRILL & REAM FOR PRESS FIT OF 1/16" DOWL PIN

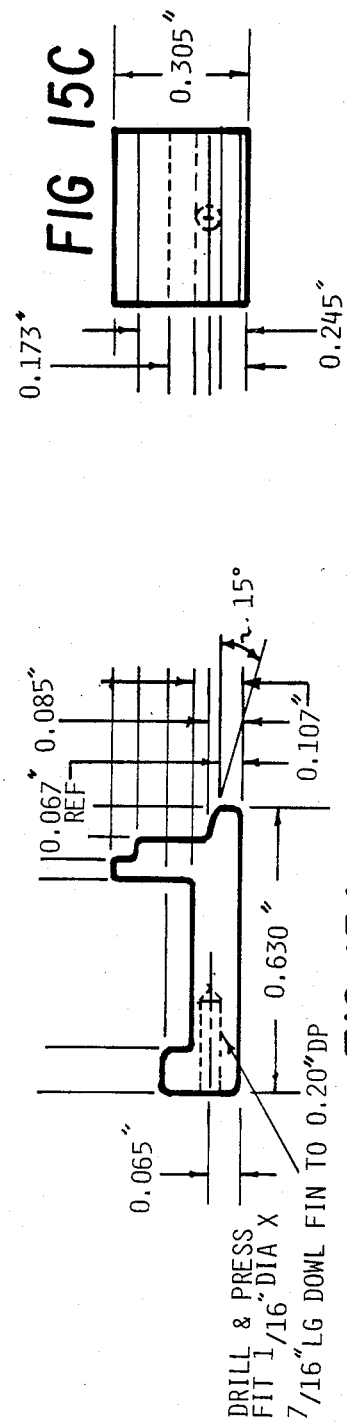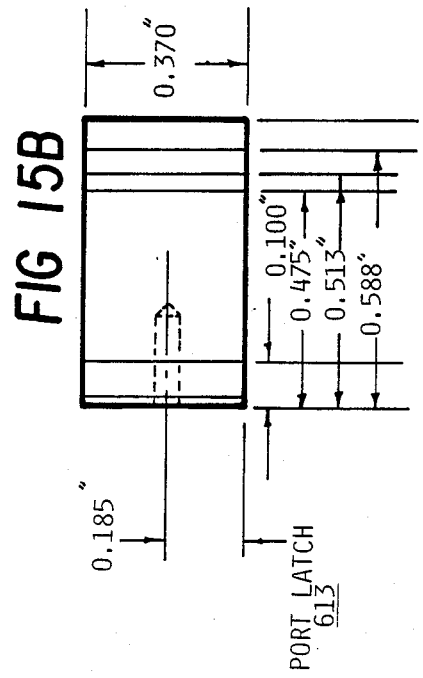

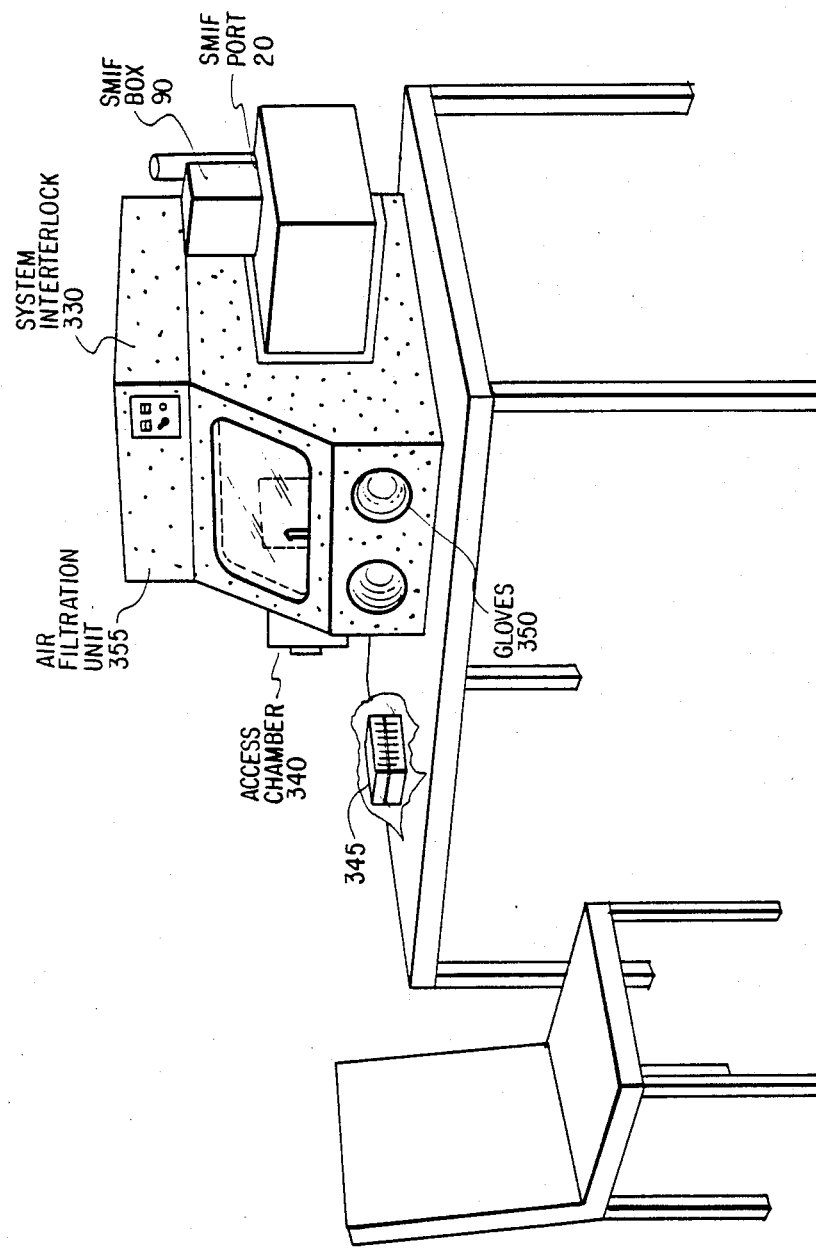

INTERLOCKING DOOR LATCH FOR DOCKABLE INTERFACE FOR INTEGRATED CIRCUIT PROCESSING

BACKGROUND

Processing yield has long been a major concern in integrated circuit (IC) manufacturing. A major cause of IC processing failures is the existence of particles such as dust in the processing environment. Conventional IC processing is therefore done in a clean room in which the air is continuously circulated and filtered in an attempt to remove the airborne particles. In addition, personnel are usually clothed in special suits in an attempt to reduce the number of particles introduced as the workers move about the clean room. As a final step, many of the most vulnerable IC process steps are further contained beneath laminar flow down-drafts of filtered air to provide added protection from local sources of particulate contamination.

Unfortunately such an environment suffers from several disadvantages. First, such specially designed rooms are not only fairly expensive to construct and maintain, but also working in such an environment is inconvenient. Second, since the size of particles which will cause product failure is usually equal to or greater than $\frac{1}{4}$ to $\frac{1}{3}$ the minimum feature size of the product, it is necessary to continually reduce contamination levels as dimensions are reduced in newer IC products in order to maintain acceptable process yields. This problem becomes especially acute as the minimum feature size drops below one micron for very large scale integrated (VLSI) ICs.

SUMMARY

As initially described by Tullis, et al., in "Particle Free Dockable Interface for Integrated Circuit Processing", U.S. patent application Ser. No. 536,600, filed Sept. 28, 1983, the present invention is a departure from the use of a conventional clean room in the fabrication of ICs. Instead, a novel standardized mechanical interface (SMIF) system is utilized that reduces particle contamination by significantly reducing particle fluxes onto wafers. This is done by mechanically assuring that during transportation, storage, and most processing steps, the gaseous media surrounding the wafers is essentially stationary relative to the wafers, and that particles from exterior "ambient" environments cannot enter the wafer environments. Experiments have shown that the SMIF system of wafer handling reduces wafer particle contamination by as much as ten times when compared to conventional Class 100 clean room wafer handling practice. In addition, since the level of SMIF system particle contamination is independent of the ambient external environment, IC manufacturing can proceed in a non-clean facility. Thus, not only is the expense and inconvenience of a clean room eliminated, but also process yields can be maintained or even improved for high density VLSI processes due to the lower concentration of particle contamination.

Experiments have shown that a significant number of processing defects in VLSI circuits are caused by particles and that many of these particles are related to material handling by humans even if low-particle clothing is employed. A sitting person with light hand, forearm and head movements even with proper clean-room clothing will emit more than 100,000 particles/minute, all larger than 0.3 microns. The SMIF system therefore consists of two parts: (1) a clean gas filled canopy around the wafer handling apparatus of each piece of processing equipment; and (2) a small, clean, still-gas box to carry wafers from machine to machine. The various pieces of the system are mechanically interfaced without the need of an air-lock by means of unique particle-free dockable doors which consist of a door on each piece of equipment that fit together to trap particles which have accumulated from the dirty ambient environment on the outer surfaces of the doors. Once linked together, the doors are moved as a unit into the clean interior space, thus opening a particle-free interface between the system components. A novel interlocking door latch is used at the particle-free interface in order to prevent the opening of the interface to the clean interiors without the presence of appropriate mating system components. Wafers can be moved through the system by mechanical arms and elevators without human intrusion. The actual wafer movement can also be fully automated through the use of robotic material handlers to further increase productivity. By eliminating human handling of IC wafers and maintaining the wafers in a still-air environment throughout the majority of the IC process, particles are reduced and process yield is increased.

DESCRIPTION OF THE DRAWINGS

FIGS. 3A, 3B and 3C show three versions of a third SMIF subsystem component, a cassette manipulator, according to a preferred embodiment of the present invention.

FIGS. 7A-7C, 8A-8C, 9A-9B, 10A-10C, 11, 12A-12C, 13A-13C, 14A-14C, and 15A-15C show the subassemblies for the embodiment of the present invention according to FIG. 6.

FIG. 18 shows a system interlock according to a preferred embodiment of the present invention.

DETAILED DESCRIPTION OF THE INVENTION

Conceptually, the SMIF system has two parts:

(1) a clean air canopy around the wafer handling apparatus of each piece of processing equipment; and (2) a small clean air box to carry wafers from machine to machine.

In practice, the SMIF system is built from several of the small clean air boxes and canopies to form SMIF subsystems, each of which are built from three SMIF subsystem components.

Figure 1:
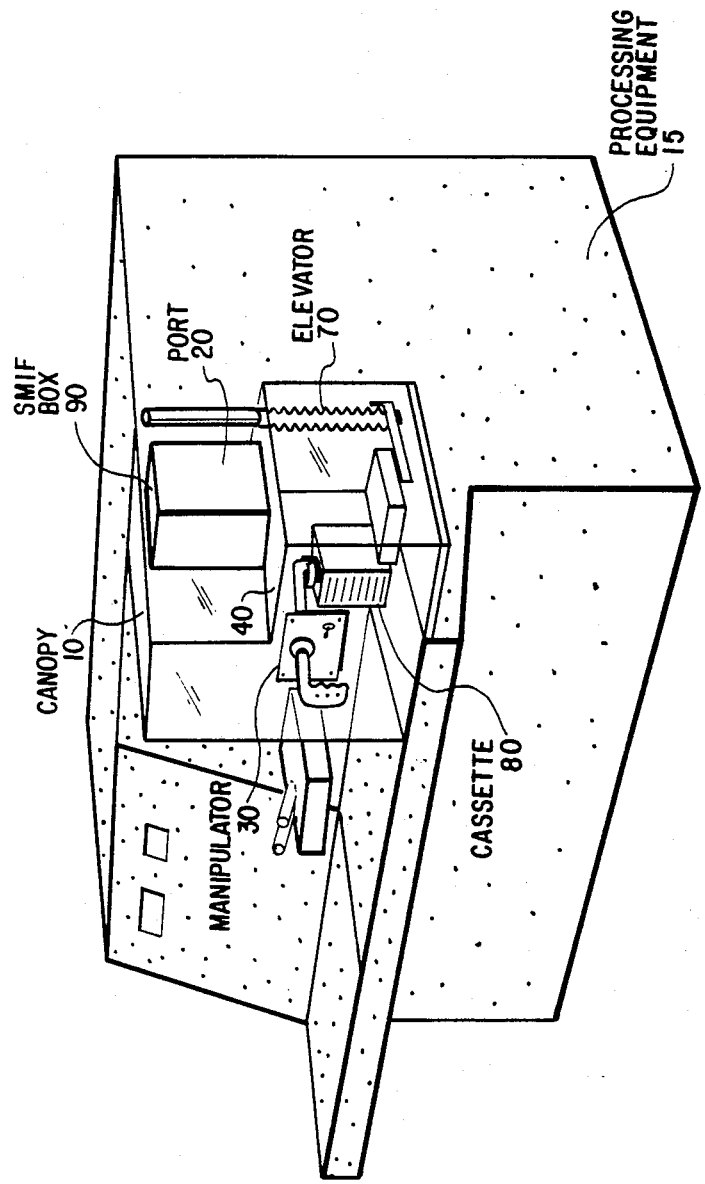
FIG. 1 shows a first SMIF subsystem component, a canopy, according to a preferred embodiment of the present invention.

The first SMIF subsystem component as shown in FIG. 1 is the canopy 10. The canopy 10 is an easily removable shield that covers the wafer handling mechanisms of each piece of processing equipment 15 (e.g., photoresist applicators, mask aligners, inspection equipment, etc.). Generally, the canopy 10 is constructed of transparent plastic such as Lexan to facilitate inspection and/or maintenance within the canopy 10 which may later become necessary. The other subsystem components are a SMIF cassette port 20 and a SMIF cassette manipulator 30 which are bolted onto the canopy 10 in locations that allow easy movement within the canopy 10. Because the canopy 10 encloses the handling mechanisms of the processing equipment 15, there is no need to enclose the processing equipment 15 within a clean room.

Figure 2A:
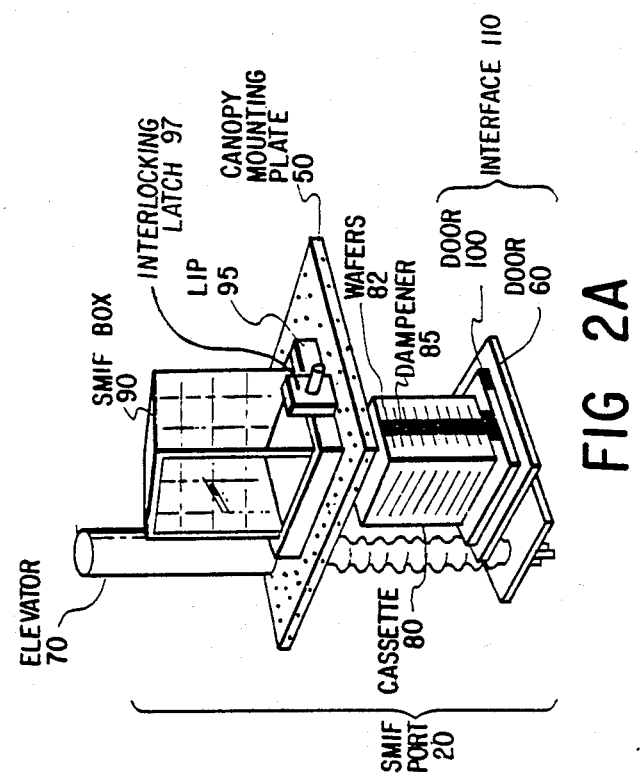
FIGS. 2A and 2B show a second SMIF subsystem component, a cassette port, according to a preferred embodiment of the present invention.
Figure 2B:
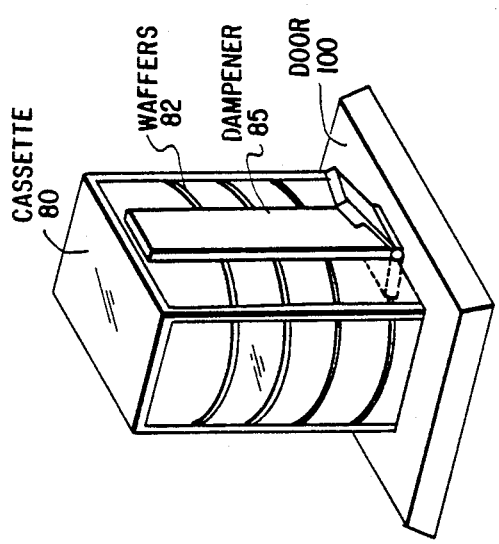

FIG. 2A shows the details of the SMIF cassette port 20. The port 20 is typically mounted on an horizontal surface 40 of the canopy 10 by means of a canopy mounting plate 50. The port 20 further consists of a port door 60 and an elevator mechanism 70 that transports a cassette 80 containing the IC wafers 82 into the interior of the canopy 10. The wafers 82 are held in the cassette 80 by a wafer dampener 85 as shown in FIG. 2B which is mounted to the door 100 and is activated by the weight of the cassette 80.

A SMIF box 90, which is used for transporting cassettes 80 from one piece of processing equipment 15 to another, interfaces with the canopy 10 via the SMIF port 20. The SMIF box 90 is aligned with the SMIF port 20 by means of a wedge shaped lip 95 and has a door 100 which interlocks with the door 60 on the port 20. An interlocking latch mechanism 97 is provided so that doors 60 and 100 can only be opened when the SMIF box 90 is positioned in the alignment lip 95. Doors 60 and 100 together provide a particle-free dockable interface 110, shown in FIG. 2A in the open position, which will be described in detail shortly. The interface 110 also provides means to latch the box 90 to the port 20 so that the elevator mechanism 70 can freely transport the cassette 80 between the box 90 and the canopy 10. The doors 60 and 100 are designed so that the majority of particles on the exterior surfaces of the doors 60 and 100 are trapped between the doors 60 and 100. Thus, the wafers carried in the cassette 80 are not contaminated when the interface 110 is opened.

Figure 3A:
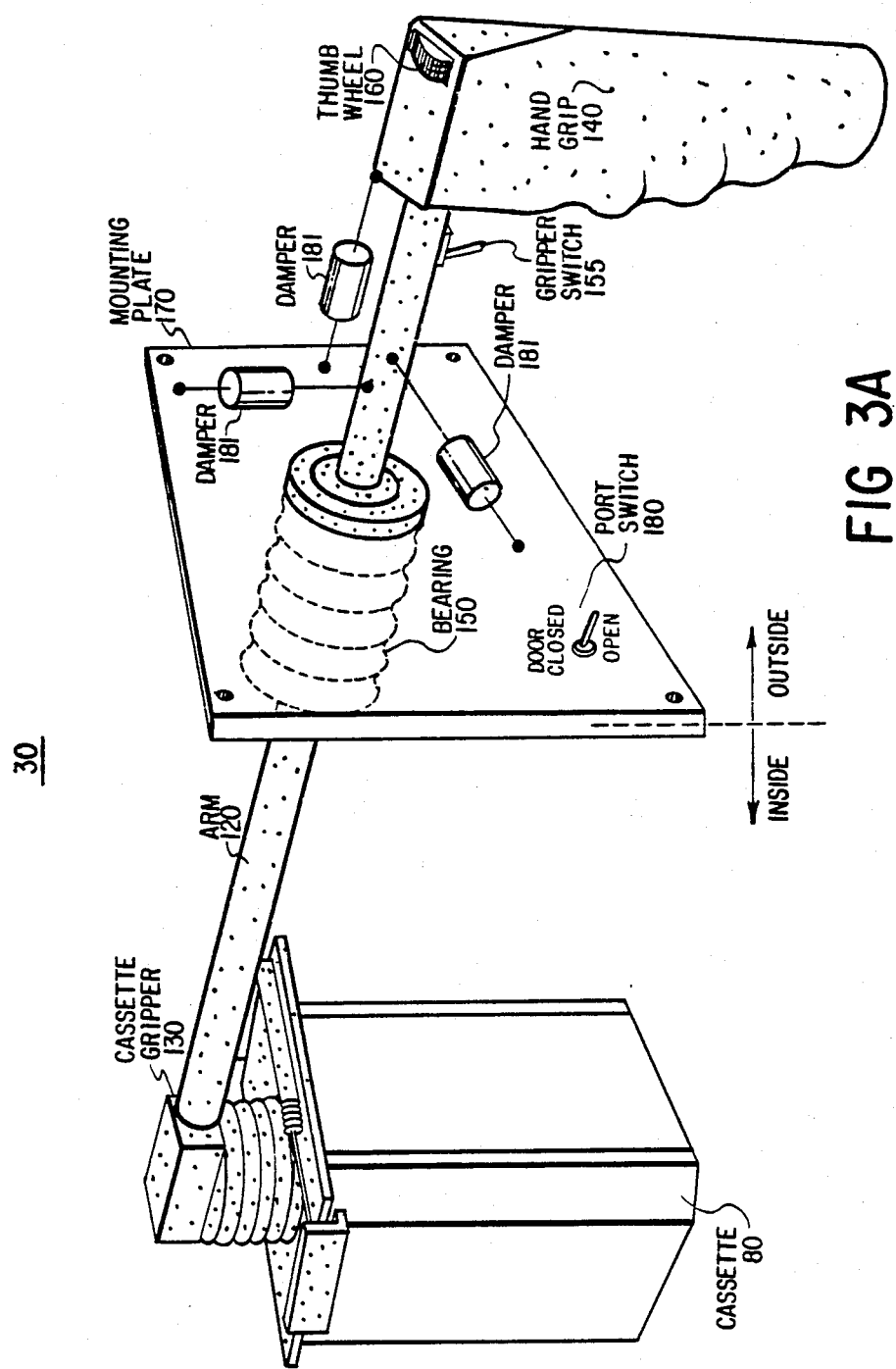
Figure 3B:
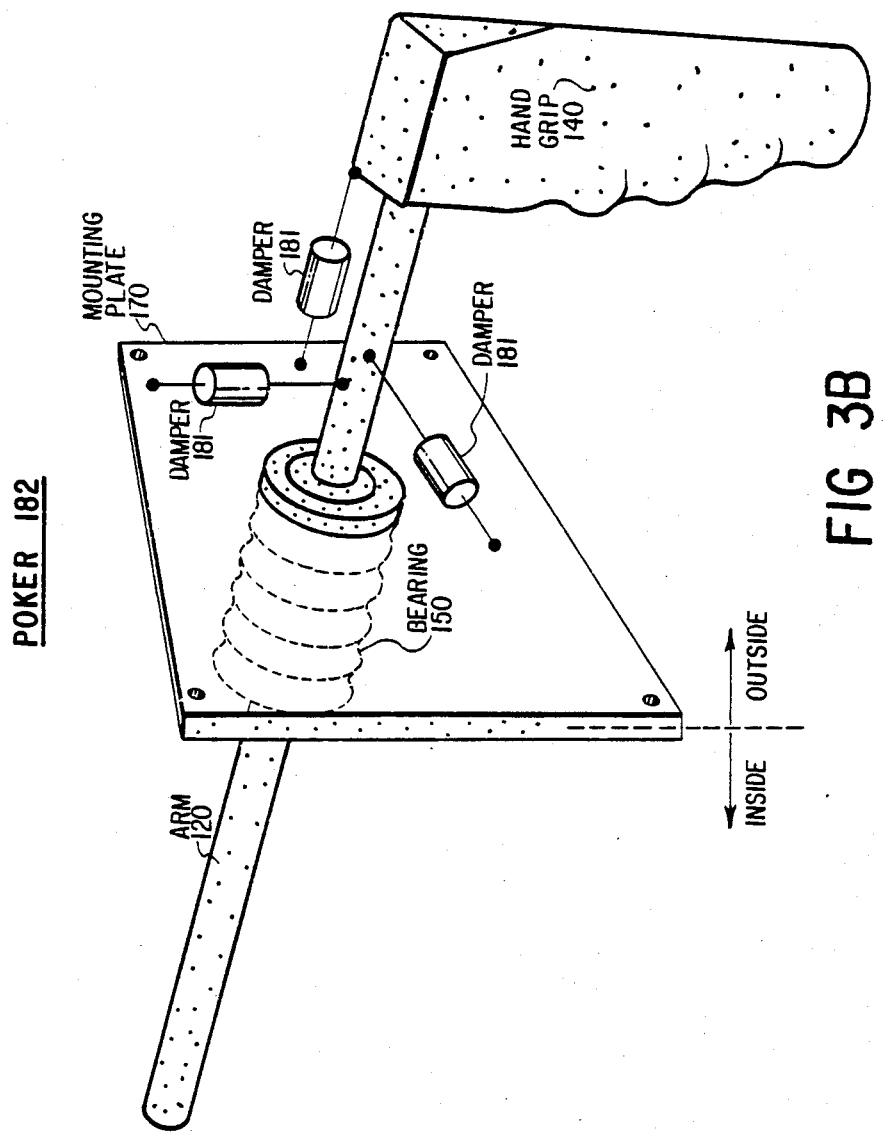

Once the cassette 80 is within the canopy 10, the cassette 80 can be maneuvered as needed by the cassette manipulator 30. A manually operated cassette manipulator 30 is shown in FIG. 3. The manipulator 30 typically has an arm 120 which is 2-3 feet long and a cassette gripper 130 on the inside (clean air) end and a hand grip 140 on the outside (ambient) end. A bearing 150 provides angular and in-out movement for the arm 120 as well as providing an air seal to prevent the intrusion of dirty ambient air. The cassette gripper 130 is actuated by gripper switch 155 to hold the cassette 80 which can then be rotated about the vertical axis by a thumb wheel 160 mounted on the hand grip 140. A manipulator mounting plate 170 supports the bearing 150 and a port actuation switch 180 which actuates the latching of doors 60 and 100 and the movement of the elevator mechanism 70. Mechanical dampers 181 are provided along the three axis of motion of arm 120 to limit the speed of the movement of the gripper 130. The manipulator mounting plate 170 is bolted to the canopy 10 as shown in FIG. 1. Two alternatives of the cassette manipulator 30 which are often useful are a poker 182 as shown in FIG. 3B and a wafer gripper 183 as shown in FIG. 3C. The poker 182 is a cassette manipulator 30 without a gripper 130 used to push objects within the canopy 10. The wafer gripper 183 is a cassette manipulator 30 with a three-pronged claw 184 or similar mechanism replacing the cassette gripper 130 so that the wafers can be grasped directly as needed.

It should be noted that both the canopy 10 and SMIF box 90 described above totally exclude humans and do not utilize constantly moving filtered air to decrease particles on the IC wafer surfaces. Rather, IC cleanliness is achieved by maintaining a still-air interior environment. The canopy 10 and box 90 can each be equipped with particle-filtered openings 11 and 91 respectively, (see FIG. 4) to allow continuous equalization between internal and external (ambient) air pressures. Such filtered pressure equalization openings 11 and 91 minimize pressure difference and air flow between the canopy 10 and box 90 as the interface 110 is opened and the wafers are moved from the box 90 into the canopy 10. In addition, access to the interiors of the canopy 10 and box 90 are by means of mechanical arms which occupy essentially constant volume within the enclosures so that there is no significant change in interior volume as IC wafers are moved about. Hence, since there is little or no change of interior air pressure during processing, there is no need for air-tight seals on the canopy 10 or box 90, and particles on the IC wafer surfaces are further decreased by inhibiting the movement of air.

Figure 4:
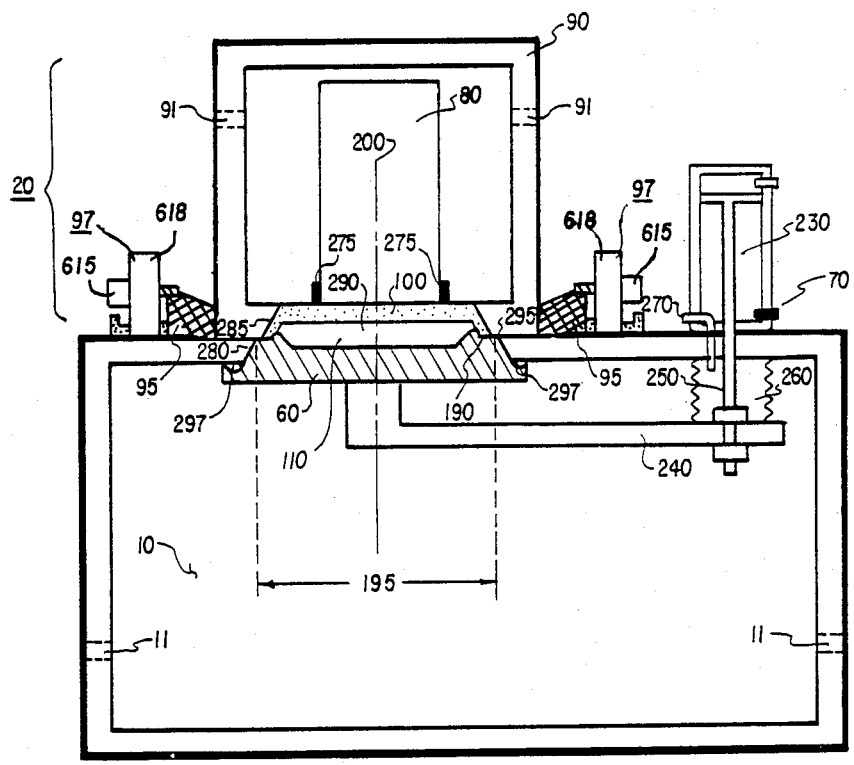
FIG. 4 shows the canopy interfaced to the cassette port according to a preferred embodiment of the present invention.
Figure 5:
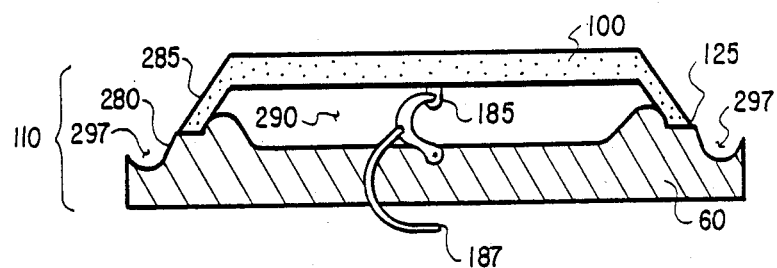
FIG. 5 shows an alternative embodiment of an interface as shown in FIG. 4.

FIG. 4 shows a vertically opened version of the SMIF cassette port 20. A horizontally opened version is also easily achieved by slight mechanical modifications to the vertically opened version to include a positive spring loaded latch 185 and release cable 187 as shown in FIG. 5 between the doors 60 and 100 since gravity cannot be used to hold the doors together. The cassette box 90 is designed to contain one cassette 80 and is only slightly larger than the cassette 80 itself, which holds the IC wafers. The cassette box 90 will generally have transparent sides to facilitate observations by humans which may be necessary. The particle-free dockable interface 110 mentioned earlier permits clean, particle-free access between two otherwise independent clean environmental systems such as the canopy 10 and the SMIF box 90. The interface 110 avoids letting air-borne particles, especially those in the size range between 0.1 to 20 microns, from entering the otherwise clean equipment containers.

FIG. 4 shows the interconnection of the envelopes of the closed spaces 10 and 90 along a contact area 190. In the present invention it is necessary to open the contact area 190 without exposing the spaces 10 and 90 to the external environment or to the previously external surfaces of doors 60 and 100 of spaces 10 and 90 respectively. In particular, when the doors 60 and 100 are opened, the portions of the external surfaces of the contact area 190 lying within the contact opening 195 are made to contact one another thereby trapping particles which may exit on the external surfaces between the doors 60 and 100. The contact area 190 is then kept in contact while the doors 60 and 100 are moved as a single unit into the space 10. The doors 60 and 100 are either circularly or rectangularly symmetrical about axis 200.

Figure 6:
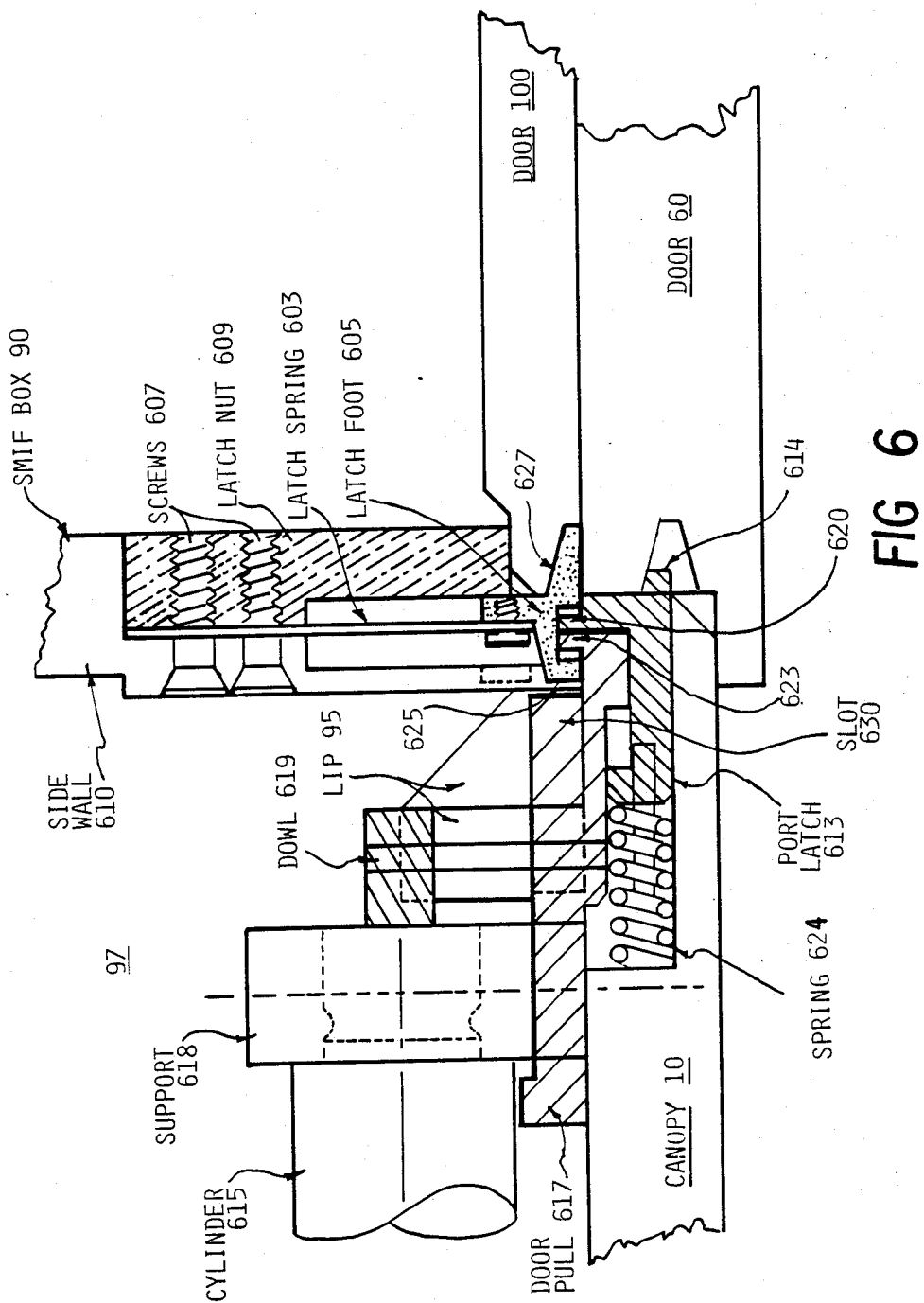
FIG. 6 shows the details of an interlocking door latch according to a preferred embodiment of the present invention.

Before the interface 110 is opened, the SMIF box 90 is aligned in lip 95 on the canopy 10 as shown in FIG. 4 to prevent the intrusion of dirty ambient air. FIG. 6 shows a cross sectional view of the details of the interlocking latch mechanism 97 which prevents the opening of door 60 at inappropriate times. A latch spring 603 and latch foot 605 are attached by screws 607 to a latch nut 609 within a side wall 610 of the SMIF box 90. The first purpose of the latch foot 605 is to retain the door 100 which forms the bottom of the SMIF box 90 via the force of the latch spring 603. The door 60 of the canopy 10 is held in place to the canopy 10 by a port latch 613 having a protrusion 614 which fits into door 60. A pneumatic latch cylinder 615 mounted on support 618 is coupled to a door pull 617 by a dowel 619, and the entire door pull assembly 615, 617, 618, and 619 is mounted on the canopy 10 above the port latch 613. The latch cylinder 615 can be either a double acting pneumatic cylinder in which a pressure must be applied to open or close the door pull 617, or a single acting pneumatic cylinder with a spring return which acts to keep the door pull 617 closed as shown to the right. Mounting of the SMIF box 90 to the canopy 10 is accomplished by placing the SMIF box 90 such that it is lined up within alignment lip 95, and the latch foot 605 lies immediately above protrusions 620 and 623 which are parts of the port latch 613 and the door pull 167, respectively. A pneumatic control signal to open the doors 60 and 100 causes the latch cylinder 615 to pull the door pull 617 to the left as shown away from the door 60. If a SMIF box 60 is not in place when the door pull 617 moves, a spring 624 prevents the port latch 613 from moving and the door 60 will remain closed and latched, thus protecting the clean air space within canopy 10 from intrusion of dirty ambient air. If a SMIF box 90 is in place as shown in FIG. 6, the door pull 617 pulls the protrusions 625 and 627 of latch foot 605 to release door 100. At the same time the protrusion 620 of the port latch 613 is pulled via protrusion 627 to disengage protrusion 614 from door 60. The pair of doors 60 and 100 can then be opened as a unit. In addition, when the doors 60 and 100 have been released, the latch foot 605 engages an inside slot 630 in the alignment lip 95 to prevent the SMIF box 90 from being lifted off of the canopy 10.

Figure 7C:
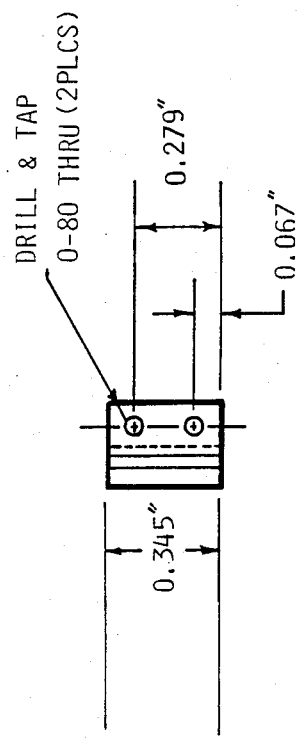
Figure 7A:
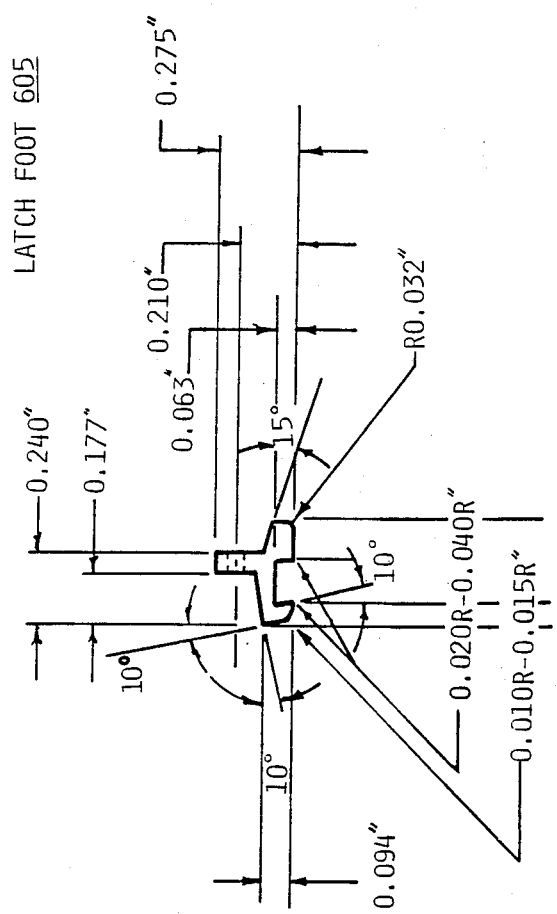
Figure 7B:
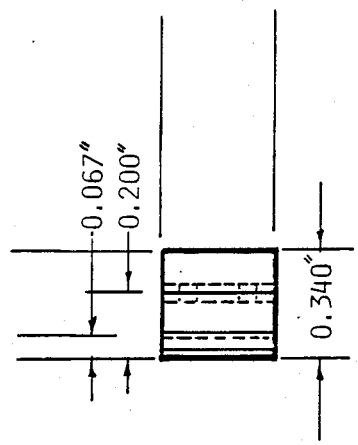
Figure 12C:
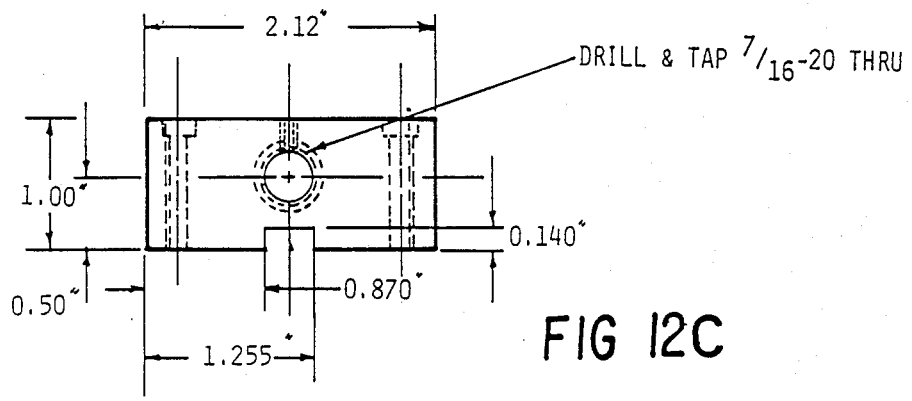
Figure 12A:
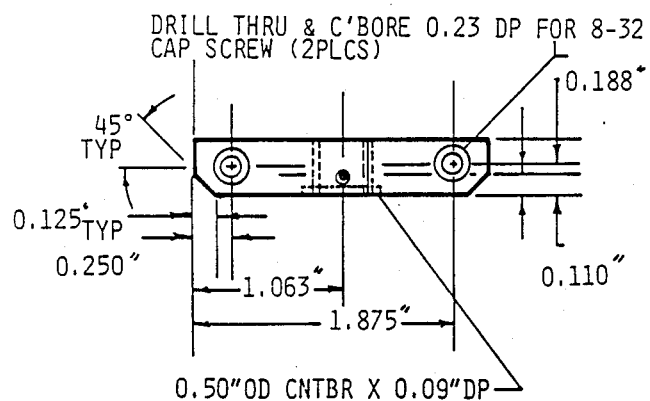
Figure 12B:
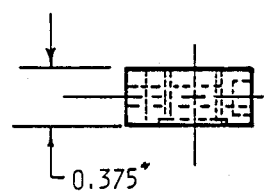
Figure 14C:
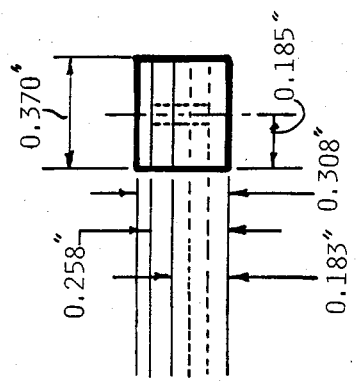
Figure 14B:
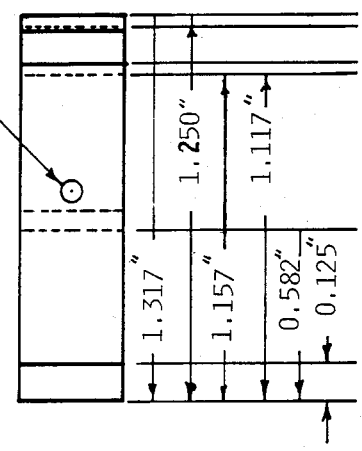
Figure 14A:
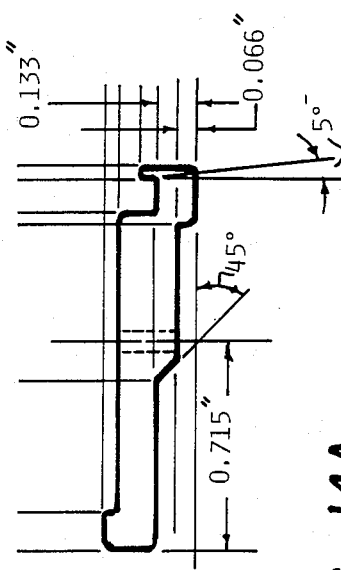

The details of the latch foot 605 are shown in FIGS. 7A-7C, the latch spring 603 is shown in FIGS. 8A-8C, and an assembled latch spring 603 and latch foot 605 is shown in FIGS. 9A and 9B. The details of the latch nut 609 are shown in FIGS. 10A-10C; the details of the latch cylinder 615 are shown in FIG. 11; the details of the support 618 are shown in FIGS. 12A-12C; the details of alignment lip 95 are shown in FIGS. 13A-13C; the details of door pull 617 are shown in FIGS. 14A-14C; and the details of port latch 613 are shown in FIGS. 15A-15C.

In the specific embodiment shown in FIG. 4, a piston 230 of the elevator 70 is located outside of spaces 10 and 90 to conserve space within the enclosures. Piston 230 is coupled to door 60 by an arm 240 and rod 250. The rod 250 passes through the wall of space 10 by means of a bellows 260 which prevents the intrusion of dirty ambient air. A vent 270 is provided to allow the equalization of air pressure inside of bellows 260 as the elevator 70 moves and the bellows 260 expands and contracts. Note that the air passing through vent 270 is dirty ambient air, but this does not contaminate space 10 because the bellows is sealed to the inside of space 10 and arm 250. To open the interface 110, latches 210 are released, piston 230 is extended, and the elevator 70 transports both doors 60 and 100 as a unit into space 10, thereby carrying the cassette 80 aligned with the aid of guide lips 275 into space 10 while trapping surface particles between the two doors 60 and 100 and preventing the intrusion of dirty ambient air.

In order to trap surface particles between doors 60 and 100 it is only necessary that the doors contact each other uniformly and closely around their outer perimeters 280 and 285 respectively. The doors 60 and 100 need not fit flush with each other along the entire interface 110. In fact, it is desirable that an air gap 290 inside of the outer perimeters 280 and 285 be left between the doors 60 and 100. The air gap 290 provides a compressive air space between the doors 60 and 100 so that the dirty air trapped between the doors 60 and 100 does not rush out at high velocity in the plane perpendicular to axis 200 as the doors 60 and 100 are brought together, thereby potentially sweeping part of the dirty trapped air into spaced 10 or 90. The air gap 290 also prevents doors 60 and 100 from becoming affixed together by air pressure as could occur if the contact area 190 was a large, closely fitting surface. Typically the air gap 290 will occupy more than 80% of the contact opening 195.

Ideally, the doors 60 and 100 should fit together so that perimeters 280 and 285 form one continuous surface. Therefore, joggle 295 where perimeters 280 and 285 meet should be kept as small as possible (e.g., less than 0.010-0.020 inch) since particles on the joggle 295 will be brought within the clean spaces 10 and 90 when the interface 110 is opened. Some particles may be present on the perimeters 280 and 285 so a particle gutter 297 is provided on door 60 to catch any particles which might roll down the perimeters 280 and 285 when the interface 110 is opened. Alternatively, particle gutter 297 can be omitted to permit any particles from the perimeters 280 and 285 to settle all the way to the bottom of the canopy 10.

Figure 16:
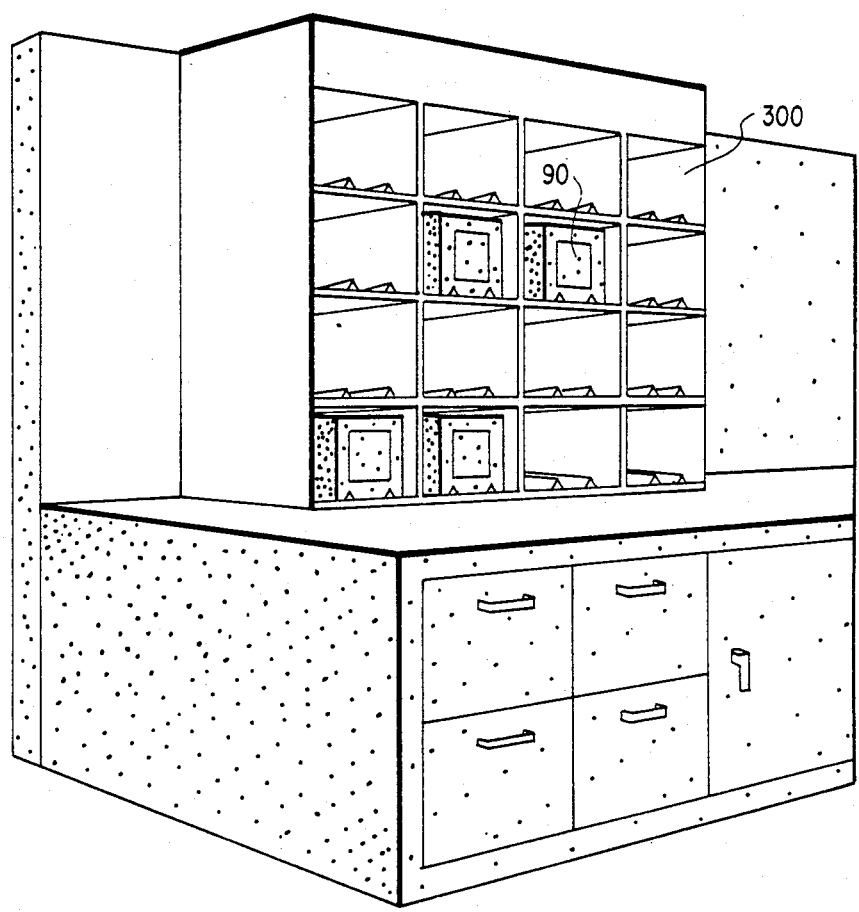
FIG. 16 shows a SMIF box storage unit according to a preferred embodiment of the present invention.

FIG. 16 shows a SMIF box storage unit 300. The box storage unit 300 is basically an open rack for storing cassette boxes 90.

Figure 17:
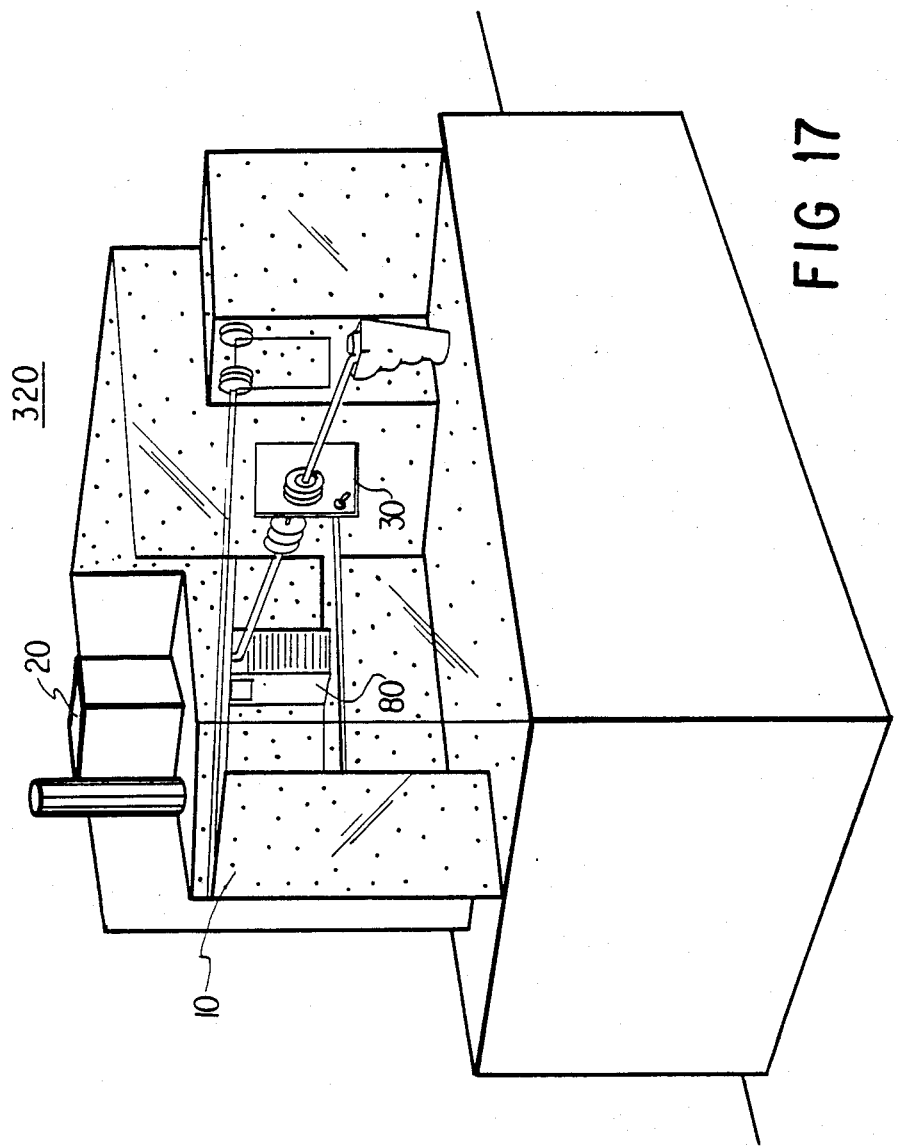
FIG. 17 shows a cassette storage unit according to a preferred embodiment of the present invention.

FIG. 17 shows a cassette storage unit 320 for storing cassettes 80 holding IC wafers. The cassette storage unit 320 is a desiccator box with a canopy 10, port 20, and manipulator 30 added to it. The cassette storage unit 320 will typically function as a cassette processing buffer.

Initial cassette entry into the SMIF system occurs through the system interlock 330 as shown in FIG. 18. This is typically a four-foot wide glove box with an access chamber 340 at one end and a SMIF port 20 at the other end. The complex movements required to transfer wafers from a new wafer package 345 into a cassette (not shown) necessitates the use of gloves 350 rather than mechanisms. Cassettes 80 and wafers enter and leave the SMIF system through the access chamber 340. Note that since the internal pressure of the system interlock 330 can change abruptly as human arms are thrust in and out of the gloves 350, it is necessary that the system interlock 330 be tightly constructed to prevent the intrusion of outside unfiltered air and it is also necessary to utilize an air filtration unit 355 on the system interlock 330. The air filtration unit 355 can contain both a conventional forced air filter and/or a particle collector such as an electrostatic precipitator. Although generally less desirable from a particle contamination standpoint than using mechanical manipulators 30 on the canopy 10 as shown in FIG. 1, gloves 350 could be used to provide further flexibility of motion within canopy 10. Such gloves 350 are especially useful to provide maintenance within canopy 10 during periods when no IC wafers are present which can be contaminated by the intrusion of outside unfiltered air caused by use of the gloves 350. Filtration units 355 could also be used on the canopy 10 during such maintenance periods to remove any particles which may have intruded.

Because ICs are transported in their own closed containers and handling is done primarily by mechanical arms it is also possible to automate the IC production facility by the use of stationary or mobile robots which use computer controlled robotic manipulators coupled to the SMIF components. Whether handling is done manually or automatically, by combining the SMIF components with conventional IC processing equipment the IC fabrication area can for the first time be constructed without the need of a conventional clean room environment, while at the same time improving IC cleanliness.

I claim:

1. An interface between first and second containers comprising:

alignment means for orienting the first container in a fixed position relative to the second container;

a first door for independently sealing the first container;

a second door for independently sealing the second container;

said first and second doors each having a mating outer surface of substantially equal exterior dimensions, so that substantially all contamination which has accumulated on the exterior surface of the doors when the containers are separated will be trapped between said doors when the containers are positioned together with said alignment means;

elevator means coupled to said doors for transporting said doors while coupled together at their mating outer surfaces into said containers as a single unit; and interlock means coupled to the first and second doors for inhibiting the opening of the first door except when the first and second containers are mated in the alignment means, said interlock means having port latch means coupled to the first container for maintaining the first door in a closed position when the port latch means is in a closed position and for permitting the first door to open when the port latch means is in an opened position, door pull means coupled to the first container for transporting the port latch means from the opened position to the closed position of the port latch means, said door pull means being adapted so as not to independently transport the port latch means from the closed position to the opened position of the port latch means, and latch foot means coupled to the second container for engaging the port latch means and door pull means so that together the door pull means and the latch foot means can transport the port latch means from the closed position to the opened position of the port latch means.

2. An interface as in claim 1 wherein said port latch means further comprises a first spring to maintain the port latch means in the closed position when the first and second containers are not mated in the alignment means, independently of the position of the door pull means.

3. An interface as in claim 1 wherein the latch foot means is further adapted for maintaining the second door in a closed position when the latch foot means is in a closed position and for permitting the second door to open when the latch foot means is in an opened position.

4. An interface means as in claim 3 wherein the latch foot means further comprises a second spring to maintain the latch foot means in the closed position when the first and second containers are not mated in the alignment means.

5. An interface as in claim 1 wherein the latch foot means is further adapted to engage the alignment means when the port latch means is transported from the closed position to the opened position by the joint action of the latch foot means and the door pull means, so that the first and second containers cannot be separated when the port latch means is in the opened position.

6. An interface as in claim 1 wherein the door pull means further comprises movement means for transporting the door pull means between first and second positions corresponding to the closed and opened positions respectively of the port latch means.

7. An interface as in claim 6 wherein the movement means comprises a double acting pneumatic cylinder.

8. An interface as in claim 6 wherein the movement means comprises a pneumatic cylinder having a third spring to maintain the door pull in the first (closed) position when the pneumatic cylinder is not energized.

* * * * *